(12) United States Patent
Ma et al.

(10) Patent No.: US 9,893,010 B2
(45) Date of Patent: Feb. 13, 2018

(54) DEVICE-MANUFACTURING SCHEME FOR INCREASING THE DENSITY OF METAL PATTERNS IN INTER-LAYER DIELECTRICS

(71) Applicant: Taiwan Semiconductor Manufacturing Company, Ltd., Hsin-Chu (TW)

(72) Inventors: Wei-Yu Ma, Taitung (TW); Fang-Tsun Chu, Taichung (TW); Kvei-Feng Yen, Hsin-Chu (TW); Yao-Bin Wang, Yangmei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/215,306

(22) Filed: Jul. 20, 2016

(65) Prior Publication Data

US 2016/0329280 A1    Nov. 10, 2016

Related U.S. Application Data

(60) Continuation of application No. 14/059,123, filed on Oct. 21, 2013, now Pat. No. 9,406,607, which is a
(Continued)

(51) Int. Cl.
| | |
|---|---|
| H01L 21/76 | (2006.01) |
| H01L 23/522 | (2006.01) |
| H01L 21/768 | (2006.01) |
| H01L 23/528 | (2006.01) |
| H01L 27/06 | (2006.01) |
| H01L 29/06 | (2006.01) |

(52) U.S. Cl.
CPC ...... *H01L 23/5226* (2013.01); *H01L 21/7684* (2013.01); *H01L 21/76816* (2013.01); *H01L 21/76879* (2013.01); *H01L 23/528* (2013.01); *H01L 27/0629* (2013.01); *H01L 29/0619* (2013.01); *H01L 2924/0002* (2013.01)

(58) Field of Classification Search
CPC ......... H01L 21/20; H01L 21/28; H01L 21/44; H01L 21/52; H01L 21/76; H01L 21/82; H01L 21/8234; H01L 21/8238; H01L 21/823; H01L 21/4763
USPC .................................................. 438/140, 454
See application file for complete search history.

(56) References Cited

U.S. PATENT DOCUMENTS

| | | | |
|---|---|---|---|
| 6,902,963 B2 | 6/2005 | Kim et al. | |
| 2003/0071263 A1 | 4/2003 | Kouno et al. | |

(Continued)

*Primary Examiner* — Chuong A Luu (74) *Attorney, Agent, or Firm* — Slater Matsil, LLP (57) ABSTRACT

A method includes forming a transistor at a surface of a semiconductor substrate, wherein the step of forming the transistor comprises forming a gate electrode, and forming a source/drain region adjacent the gate electrode. First metal features are formed to include at least portions at a same level as the gate electrode. Second metal features are formed simultaneously, and are over and contacting the first metal features. A first one of the second metal features is removed and replaced with a third metal feature, wherein a second one of the second metal features is not removed. A fourth metal feature is formed directly over and contacting the gate electrode, wherein the third and the fourth metal features are formed using a same metal-filling process.

20 Claims, 8 Drawing Sheets

Related U.S. Application Data division of application No. 13/149,547, filed on May 31, 2011, now Pat. No. 8,569,129.

(56) References Cited

U.S. PATENT DOCUMENTS

| | | |
|---|---|---|
| 2004/0087067 A1* | 5/2004 | Yoneda ............ G02F 1/136227 438/148 |
| 2005/0112813 A1 | 5/2005 | Yoneda et al. |
| 2005/0285173 A1 | 12/2005 | Nagai et al. |
| 2009/0014796 A1 | 1/2009 | Liaw |
| 2009/0130842 A1 | 5/2009 | Hwang et al. |
| 2010/0052075 A1* | 3/2010 | Yeh .................. H01L 21/82381 257/410 |
| 2010/0276762 A1 | 11/2010 | Hayashi et al. |
| 2011/0260158 A1 | 10/2011 | Takemura |
| 2012/0112297 A1 | 5/2012 | Yamakawa et al. |

\* cited by examiner

DEVICE-MANUFACTURING SCHEME FOR INCREASING THE DENSITY OF METAL PATTERNS IN INTER-LAYER DIELECTRICS

This application is a continuation of U.S. patent application Ser. No. 14/059,123, filed on Oct. 21, 2013, now U.S. Pat. No. 9,406,607 entitled "Device-Manufacturing Scheme for Increasing the Density of Metal Patterns in Inter-Layer Dielectrics," which is a divisional of U.S. patent application Ser. No. 13/149,547, entitled "Device-Manufacturing Scheme for Increasing the Density of Metal Patterns in Inter-Layer Dielectrics," filed on May 31, 2011, now U.S. Pat. No. 8,569,129 which application is incorporated herein by reference.

BACKGROUND

The formation of metal patterns, which are used for interconnecting integrated circuit devices on semiconductor substrates, often involves the process of forming a dielectric layer, forming openings in the dielectric layer, filling the openings with a metallic material, and polishing the metallic material to remove excess metallic materials. The remaining metallic material in the openings thus forms contact plugs, vias, metal lines, or the like.

In the etching for forming openings and the polishing processes (which are sometimes chemical mechanical polish (CMP) processes), the pattern density of the metal lines need to be in certain range so that there is a relatively uniform pattern density throughout the respective wafer. Otherwise, the micro-loading effect may occur, and the yield may be adversely affected. For example, in the formation of metal features (sometimes referred to as M0_PO) that are connected to metal gates, it is required that in any chip area with a size equal to 20 μm×20 μm, the density of the M0_PO patterns is between 1 percent and about 20 percent. If the pattern density is out of this specified range, the yield in the etching process and the polishing process may be affected.

The requirement in the density of the M0_PO patterns, however, is difficult to achieve. There may exist large chip areas that do not include M0_PO patterns therein. For example, in diodes (which often occupy large chip areas) and guard rings, there may not be M0_PO patterns. Although dummy M0_PO patterns may be inserted in these regions to increase the pattern density, the inserted dummy M0_PO patterns occupy the chip areas that otherwise could be useful. Therefore, the insertion of the dummy M0_PO patterns causes the reduction in the device utilization rate. In some devices such as I/O cells and electrostatic discharge (ESD) circuits, the reduction in the device utilization rate may seriously impact the ESD ability and the latch-up performance of circuits.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of improving the uniformity in the density of metal interconnect patterns in inter-layer dielectric (ILD) is provided in accordance with an embodiment, and the resulting integrated circuit structures is provided. The intermediate stages of manufacturing various embodiments are illustrated. The variations of the embodiment are discussed. Throughout the various views and illustrative embodiments, like reference numbers are used to designate like elements. Throughout the description, the symbol "M1" may be used to refer to the feature in a bottom metal layer M1, while the symbol "M0" may be used to refer to the metal features under metal layer M1.

Figure 1:
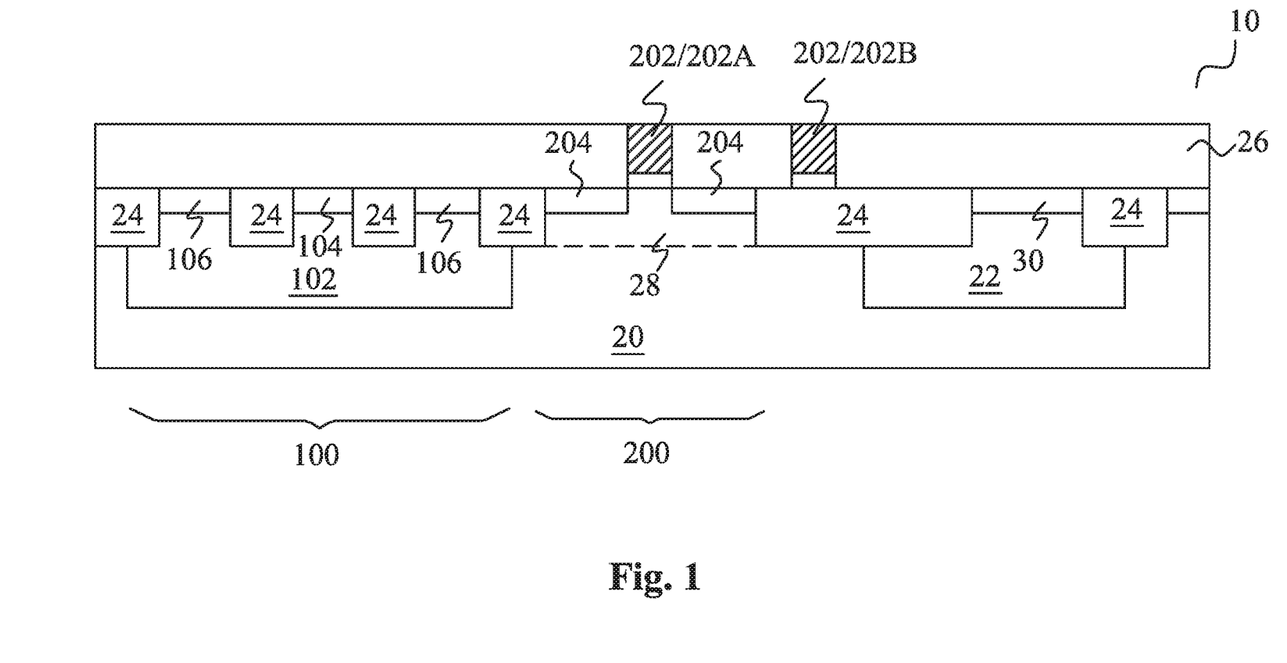
FIGS. 1 through 8 are cross-sectional views of intermediate stages in the manufacturing of metal interconnect patterns in inter-layer dielectric (ILD) in accordance with various embodiments.

Referring to FIG. 1, wafer 10 is provided, and the features as illustrated in FIG. 1 are formed. Wafer 10 includes substrate 20, which may be formed of a commonly used semiconductor materials such as silicon, silicon germanium, or the like, and may be a bulk substrate or a semiconductor-on-insulator (SOI) substrate. Isolation regions 24, which may be shallow trench isolation (STI) regions, are formed in substrate 20. Various devices, including diode 100, metal-oxide-semiconductor (MOS) device (a transistor) 200, and guard ring 30, are formed. Diode 100 includes a cathode and an anode. In an exemplary embodiment, diode 100 includes n-well region 102, anode 104, which may be a heavily doped p-type (P+) region, and cathode 106, which may be a heavily doped n-type (N+) region. In alternative embodiments, the conductivity types of regions 102, 104, and 106 may be inversed. In the described embodiments, the term "heavily doped" means an impurity concentration of above about 10¹⁹/cm3. One skilled in the art will recognize, however, that "heavily doped" is a term of art that depends upon the specific device type, technology generation, minimum feature size, and the like. It is intended, therefore, that the term be interpreted in light of the technology being evaluated and not be limited to the described embodiments.

MOS device (transistor) 200 includes gate electrode 202A and source drain regions 204. Gate electrode 202A is formed over active region (OD) 28. Gate electrode 202A may be a metal gate, although it may also be formed of polysilicon, metal silicides, or the like. Gate electrode 202A is formed in inter-layer dielectric (ILD) 26. In an embodiment, gate electrode 202A is formed using a gate-last approach (although the gate-first approach is also usable). As a result, the top surface of gate electrode 202A is level with the top surface of ILD 26. At the time gate electrode 202A is formed, gate electrode 202B may be formed, which may be a dummy gate, or may be a portion of another gate electrode that is connected to another MOS device (not shown). Accordingly, gate electrodes 202A and 202B (which are alternatively referred to as 202) are formed of a same material and may be formed simultaneously.

Well region 22 and guard ring 30 are formed in substrate 20. In an embodiment, well region 22 is an n-well region, and guard ring 30 is an N+ region. Alternatively, well region 22 is a p-well region, and guard ring 30 is a P+ region. Guard ring 30 may, or may not, form a ring encircling (in a top view of wafer 10) an integrated circuit device (not shown) and/or a device region with a plurality of devices therein.

Figure 2:
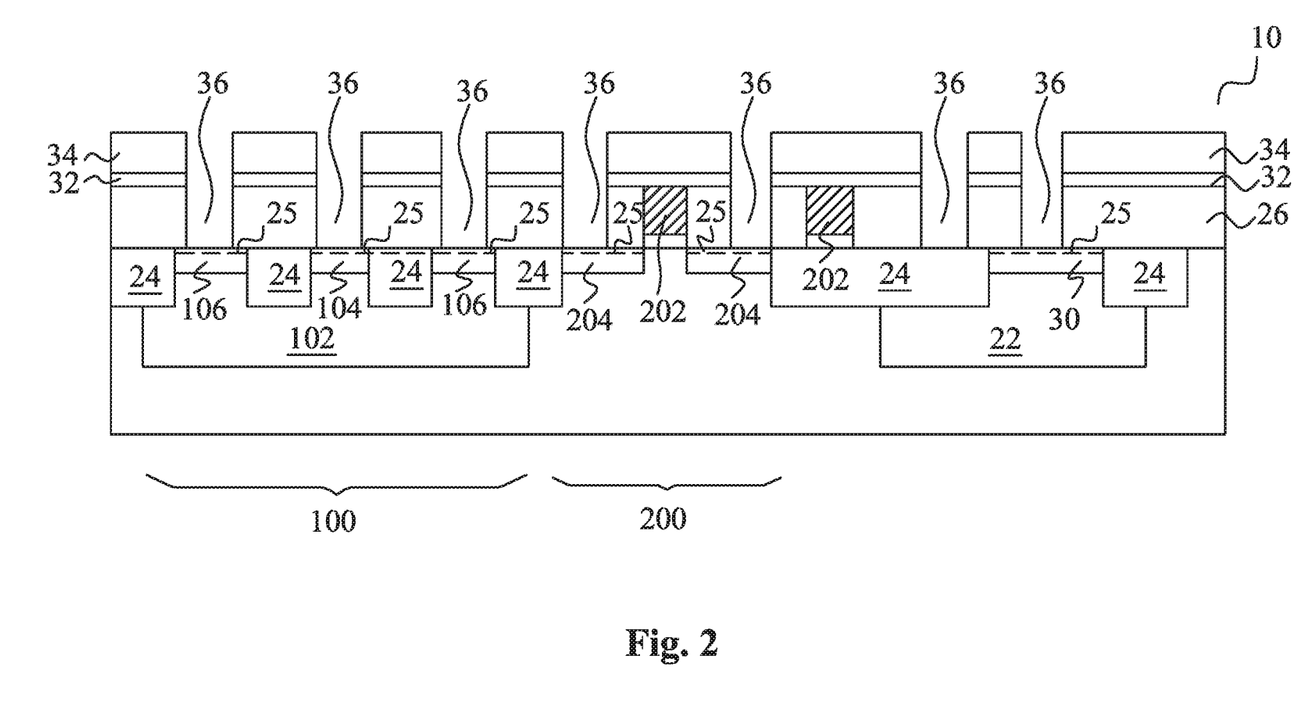
Figure 3:
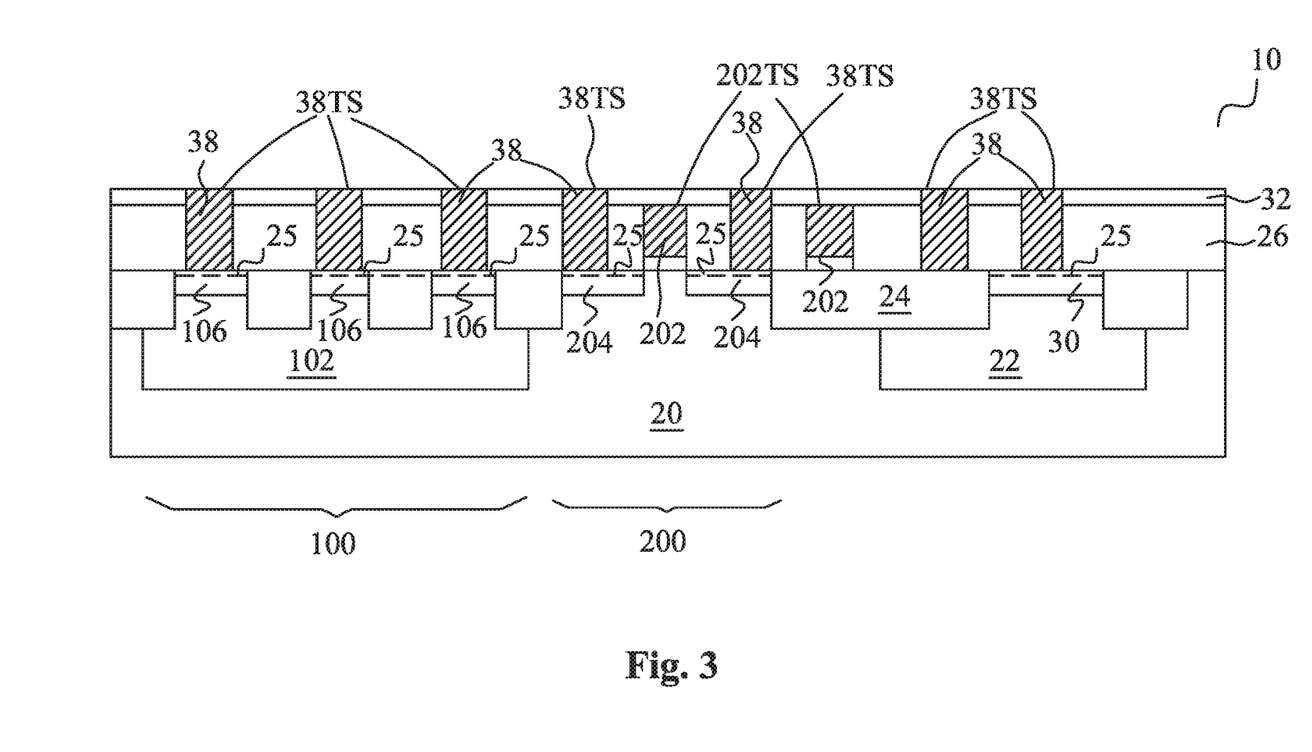

Referring to FIG. 2, dielectric layer 32 is formed over ILD and gate electrodes 202. Dielectric layer 32 and ILD 26 are patterned, for example, using the patterned photo resist 34. Openings 36 are formed, wherein anode/cathode regions 104, 106, source/drain regions 204, and guard ring 30 (or the silicide regions 25, if any, over and contacting regions 104/106/204/30) have portions exposed through openings 36. Next, as shown in FIG. 3, photo resist 34 is removed, and a metallic material is filled into opening 36. A chemical mechanical polish (CMP) is then performed using dielectric layer 32 as a CMP stop layer (a polish stop layer). As a result, metal contacts/lines 38 (alternatively referred to as M0_OD1 features 38 hereinafter) are formed. M0_OD1 features 38 and gate electrodes 202 all have portions in, and at a same level as, ILD 26. M0_OD1 features 38 include portions directly over cathode/anode 104/106 of diode 100, portions directly over source/drain regions 204 of MOS device 200, and/or portions directly over guard ring 30. Also, M0_OD1 features 38 may be in contact with doped regions 104/106/204/30 (or the respective silicide regions 25, if any). In an embodiment, M0_OD1 features 38 are formed of tungsten or tungsten alloys. Accordingly, the material of M0_OD1 features 38 may be different from the material of gate electrode 202, which may be selected to have suitable work functions.

In an embodiment, as shown in FIGS. 2 and 3, dielectric layer 32 is used as the CMP stop layer for forming M0_OD1 features 38. Accordingly, in the illustrated exemplary embodiment, top surfaces 38TS of M0_OD1 features 38 may be higher than top surfaces 202TS of gate electrodes 202. In alternative embodiments, the formation of dielectric layer 32 is skipped, and the rest of the process is essentially the same as shown in FIGS. 2 and 3. Accordingly, ILD 26 acts as the CMP stop layer, and hence the top surfaces 38TS of M0_OD1 features 38 and top surfaces 202A of gate electrodes 202 are level with each other.

Figure 4:
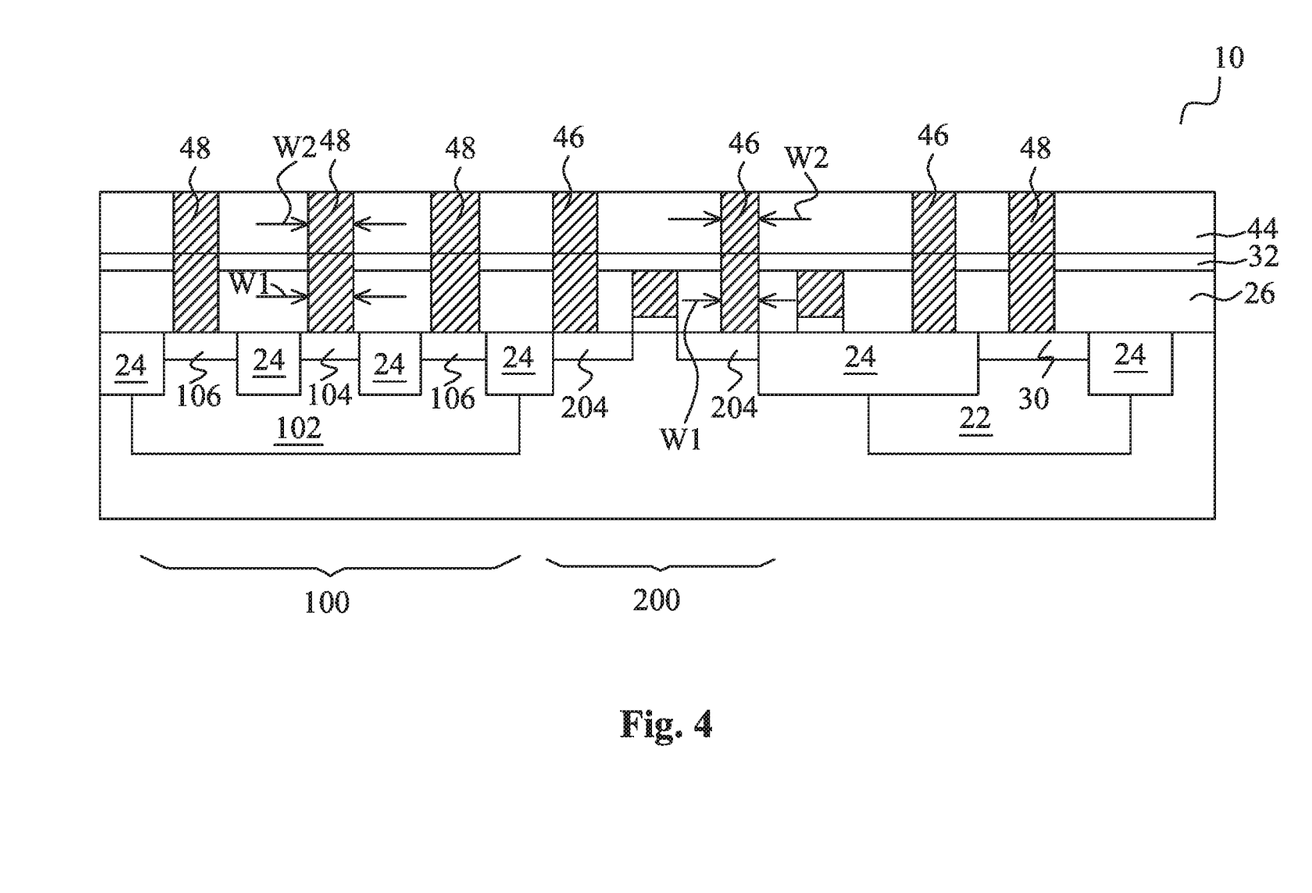

FIG. 4 illustrates the formation of dielectric layer 44 and metal features 46 and 48 (referred to as M0_OD2 features hereinafter) in dielectric layer 44. The formation of metal features 46 and 48 may include a damascene process, which includes forming openings in dielectric layer 44, filling a metallic material in dielectric layer 44, and performing a polish such as a CMP to remove excess materials. The remaining portions of the metallic material are metal features 46 and 48. Although M0_OD2 features 46 and 48 are simultaneously formed using a same material, reference numeral 48 is used to refer to the features that are likely to be etched in subsequent steps, while reference numeral 46 is used to refer to the features that will not be etched in subsequent steps. In an embodiment, M0_OD2 features 48 are formed directly over diode 100, over guard ring 30, or over both diode 100 and guard ring 30. M0_OD2 features 46 are formed directly over source/drain regions 204 of MOS device 200 and possibly directly over STI region 24. In an embodiment, M0_OD2 features 46 and 48 have same width W2, which may be the same as the width W1 of underlying M0_OD1 features 38.

Figure 5:
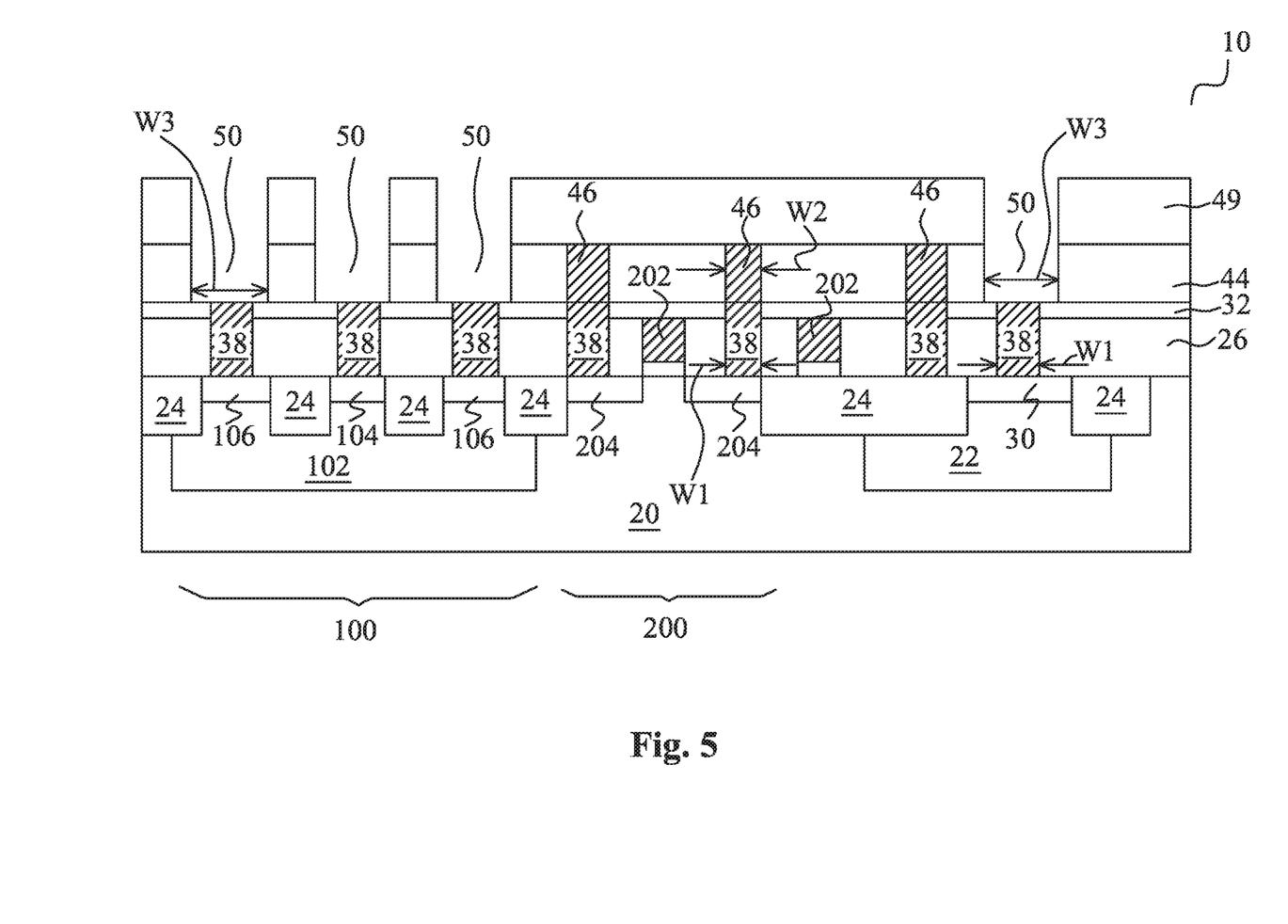

Referring to FIG. 5, dielectric layer 44 is patterned again using photo resist 49 as a mask, wherein M0_OD2 features 48 are etched to form openings 50, and M0_OD2 features 46 are not etched. In an embodiment, in addition to etching M0_OD2 features 48, portions of ILD 44 are also etched to expand the width of openings 50 from W2 to W3, which is greater than widths W1 and W2. In an embodiment, width W3 is greater than about 125 percent width W1, or greater than about 200 percent width W1. Photo resist 49 is then removed.

Figure 6:
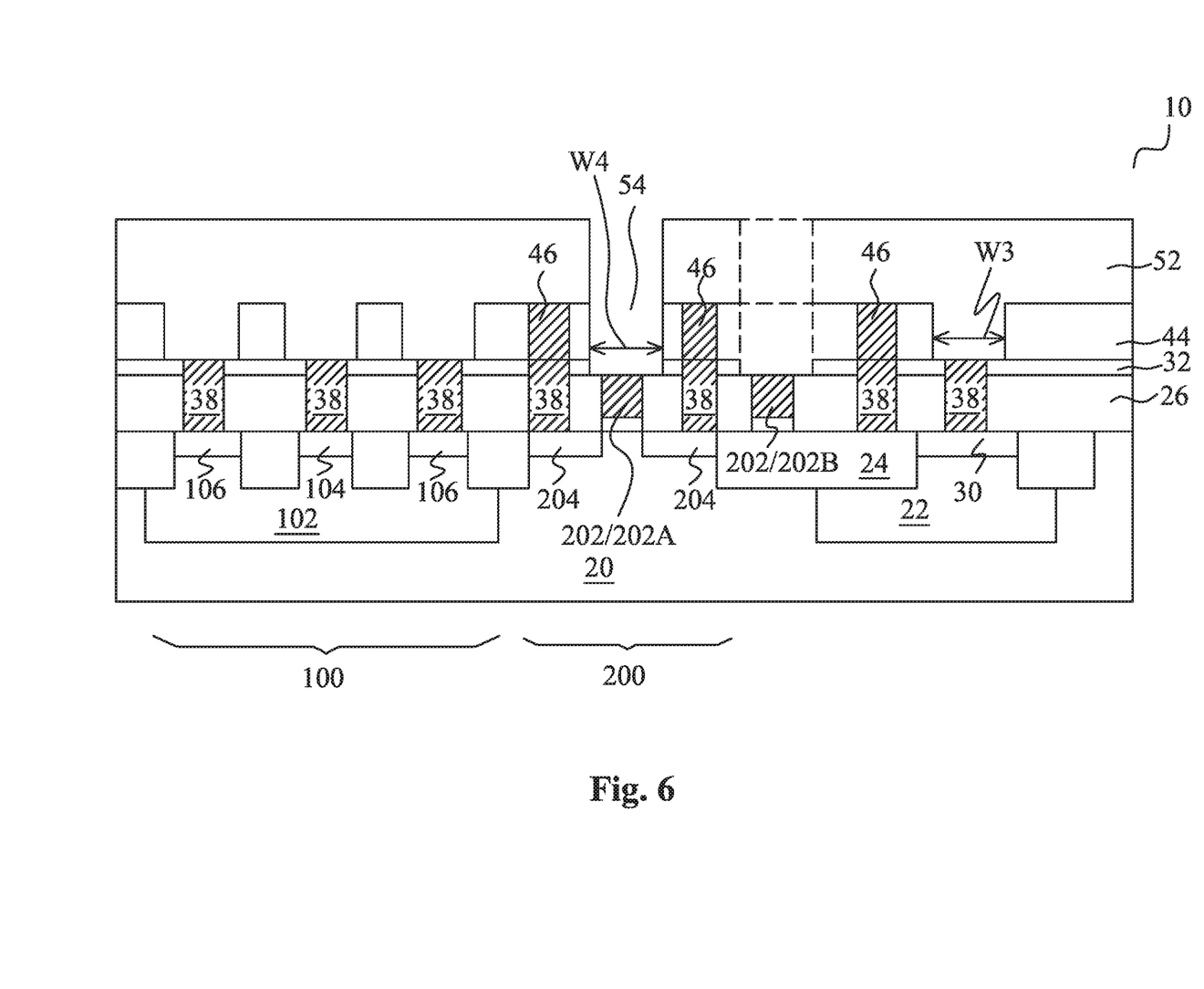

Referring to FIG. 6, photo resist 52 is formed and patterned, and openings 54 are formed in ILD 44 using patterned photo resist 52 as a mask. Accordingly, gate electrode 202A is exposed. Gate electrode 202B may not be exposed if it is a dummy gate electrode. Otherwise, if it is used as a horizontal connection to a gate of a transistor, it may, or may not, be exposed through one of the optional openings 54. Photo resist 52 is then removed. In an embodiment, width W3 of openings 50 (FIG. 5) and width W4 of openings 54 are substantially equal to each other, and may also be greater than about 125 percent width W1, or greater than about 200 percent width W1.

Figure 7:
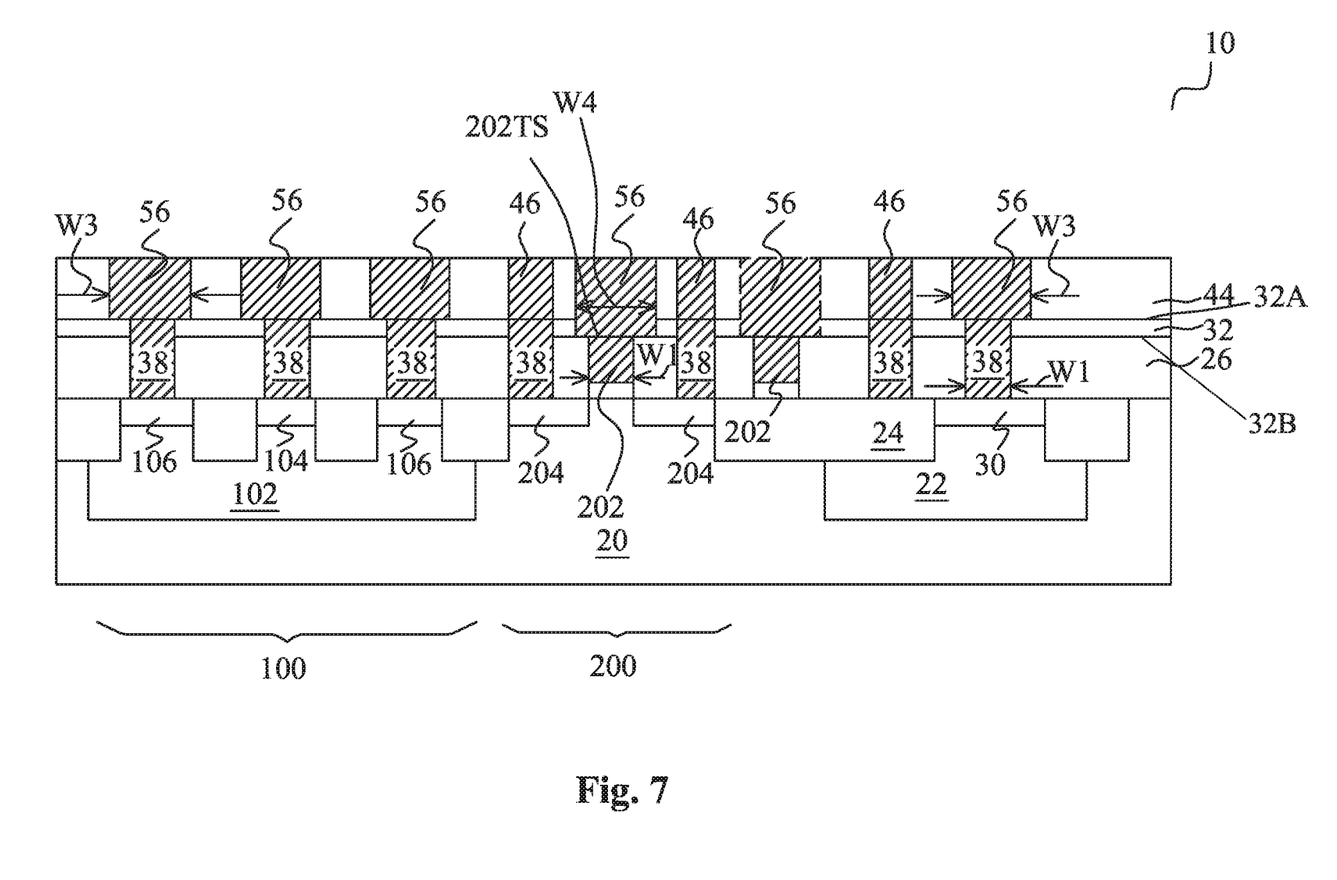

FIG. 7 illustrates the formation of metal lines or plugs (referred to as M0_PO features hereinafter) 56, which are also formed by filling a metallic material such as copper or a copper alloy into openings 50 and 54, and performing a CMP to remove excess materials. It is observed that the etching of M0_OD2 features 48 (FIG. 4) to form openings 50 (FIG. 5) results an increase in the pattern density of M0_PO features 56 in the regions directly over diode 100 and guard ring 30. Diode 100 and guard ring 30 are likely the regions having low densities of M0_PO features. Accordingly, in the embodiments, the pattern density of M0_PO features 56 directly over diode 100 and guard ring 30 is increased, which is beneficial for the CMP process for forming M0_PO features 56. In an embodiment, the determination as which of the M0_OD1 features are etched may take into the consideration of the desirable pattern density of the resulting M0_PO features 56, which may fall into 1 percent and 20 percent in any chip region having a size equal to 20 μm×20 μm.

In the embodiments wherein dielectric layer 32 is formed, M0_PO features 56 that are directly over source/drain regions 204 and STI region 24 may have bottom surfaces level with bottom surface 32B of dielectric layer 32. On the other hand, M0_PO features 56 that are directly over diode 100 and guard ring 30 may have bottom surfaces level with top surface 32A of dielectric layer 32. It is observed that M0_PO features 56 may form horizontal lines as compared to conventional contact plugs that have square top-view shapes. M0_PO features 56 are distinguished from conventional M1 features (in metal layer M1) in that some of M0_PO features 56 contact top surfaces 202TS of gate electrodes of transistors such as 202A, while the M1 metal features will be vertically spaced apart from gate electrodes of transistors. The top surfaces of features 56 may be level with each other. M0_PO features 56 may be formed of substantially pure copper or a copper alloy.

Figure 8:
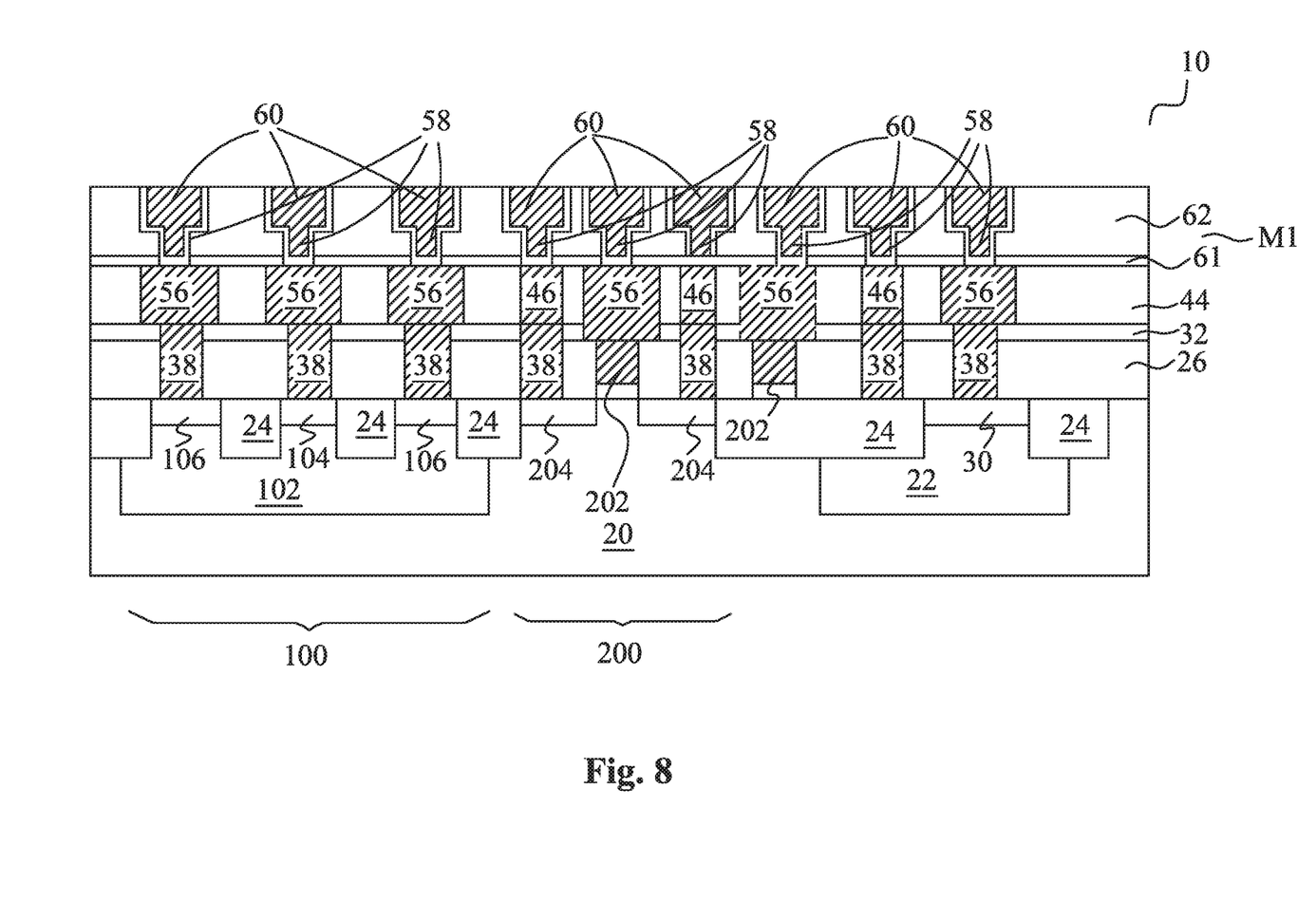

FIG. 8 illustrates the formation of etch stop layer 61, M0 vias 58, and metal lines 60 in bottom metal layer M1. M0 vias 58 and metal lines 60 are formed in dielectric layer 62, wherein dielectric layer 62 may be formed of a low-k dielectric material having a k value smaller than about 3.0, or smaller than about 2.5, for example. M0 vias 58 and metal lines 60 may be formed using a dual-damascene process, and hence no noticeable interfaces are formed between M0 vias 58 and the respective overlying metal lines 60. In alternative embodiments, M0 vias 58 may be formed using a single-damascene process, and metal lines 60 may also be formed using a single-damascene process. In subsequent process, more metal layers (not shown) may be formed over metal layer M1.

By using the embodiments, the portions of M0_OD2 features 48 (FIG. 4) directly over diode 100 and guard ring 30 are formed first, and hence contribute to improving the pattern density for forming M0_OD2 features. In the later etching of M0_OD2 features 48 and the replacement of M0_OD2 features 48 with M0_PO features 56, the openings formed by the removed M0_OD2 features 48 also contribute to the increase in the pattern density of M0_PO features 56.

In accordance with embodiments, a method includes forming a transistor at a surface of a semiconductor substrate, wherein the step of forming the transistor includes forming a gate electrode, and forming a source/drain region adjacent the gate electrode. First metal features are formed to include at least portions at a same level as the gate electrode. Second metal features are formed simultaneously, and are over and contacting the first metal features. A first one of the second metal features is removed and replaced with a third metal feature, wherein a second one of the second metal features is not removed. A fourth metal feature is formed directly over and contacting the gate electrode. The third and the fourth metal features are formed using a same metal-filling process.

In accordance with other embodiments, a method includes forming a transistor comprising a gate electrode over a semiconductor substrate; and forming a source/drain region adjacent the gate electrode. A guard ring is formed as a heavily doped region in a well region of the semiconductor substrate. A diode is formed at a surface of the semiconductor substrate. A first dielectric layer is formed over the guard ring and the diode, wherein the gate electrode includes at least a portion level with the first dielectric layer. First metal features are formed, wherein each of the first metal features includes at least a portion in the first dielectric layer. The first metal features include a first one directly over and electrically coupled to the diode, a second one directly over and electrically coupled to the source/drain region, and a third one directly over and electrically coupled to the guard ring. A second dielectric layer is formed over the first dielectric layer. Second metal features are formed in the second dielectric layer, wherein the second metal features include a first one, a second one, and a third one directly over and electrically connected to the first, the second, and the third ones of the first metal features, respectively. At least one of the first and the third ones of the second metal features is removed to form at least a first opening, wherein a respective one of the first metal features is exposed through the first opening. The second dielectric layer is patterned to form a second opening, wherein a portion of the gate electrode is exposed through the second opening. The first and the second openings are filled with a metallic material to form third metal features.

In accordance with yet other embodiments, an integrated circuit structure includes a transistor, which includes a gate electrode over a semiconductor substrate; and a source/drain region adjacent the gate electrode. A guard ring is in a well region of the semiconductor substrate. A diode is at a surface of the semiconductor substrate. A first dielectric layer is over the guard ring and the diode, wherein the gate electrode is in the first dielectric layer. The integrated circuit structure further includes first metal features, wherein each of the first metal features includes at least a portion in the first dielectric layer, and wherein the first metal features include a first one directly over and electrically coupled to the diode, a second one directly over and electrically coupled to the source/drain region, and a third one directly over and electrically coupled to the guard ring. A second dielectric layer is over the first dielectric layer. Second metal features are in the second dielectric layer, wherein the second metal features includes a first one, a second one, and a third one directly over and contacting the first, the second, and the third ones of the first metal features, respectively. The second one of the second metal features has substantially a same width as a width of the second one of the first metal features. At least one of the first and the third ones of the second metal features has a first width greater than a second width of a respective one of the first and the third ones of the first metal features.

In accordance with an embodiment, a method includes forming a gate electrode over a top surface of a semiconductor substrate, depositing a first dielectric layer around the gate electrode, forming a first metal feature in the first dielectric layer, and depositing a second dielectric layer over the first dielectric layer and the first metal feature. The method further includes forming a second metal feature over the first metal feature and replacing the second metal feature with a third metal feature. The third metal feature is wider than the second metal feature.

In accordance with another embodiment, a method includes depositing a first dielectric layer over a first source/drain region at a surface of a semiconductor substrate. The first dielectric layer extends along sidewalls of a gate electrode adjacent the first source/drain region. The method further includes forming a first source/drain contact extending through the first dielectric layer and electrically connected to the first source/drain region, depositing a second dielectric layer over the first dielectric layer, patterning a first opening through the second dielectric layer and exposing the first source/drain contact, and filling the first opening with a conductive material to form a first conductive via in the second dielectric layer. The method further includes after forming the first conductive via, patterning a second opening through the second dielectric layer and exposing the gate electrode. The second opening is wider than the first opening. The method further includes filling the second opening with a conductive material to form a gate contact in the second dielectric layer.

In accordance with yet another embodiment, a device includes a transistor including: a first source/drain region at a top surface of a semiconductor substrate, a gate electrode in a first dielectric layer, and a second source/drain region at the top surface of the semiconductor substrate and disposed on an opposing side of the gate electrode as the first source/drain region. The device also includes a second dielectric layer over the first dielectric layer. The device also includes a first conductive via in the second dielectric layer. The first conductive via is electrically connected to and disposed directly over the first source/drain region. The device also includes a second conductive via in the second dielectric layer. The second conductive via is electrically connected to and disposed directly over the second source/drain region. The device also includes a gate contact in the second dielectric layer and in direct contact with the gate electrode. The gate contact is physically separated from and wider than the first conductive via and the second conductive via.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a gate electrode over a top surface of a semiconductor substrate;
   depositing a first dielectric layer around the gate electrode;
   forming a first metal feature in the first dielectric layer;
   depositing a second dielectric layer over the first dielectric layer and the first metal feature;
   forming a second metal feature over the first metal feature; and
   replacing the second metal feature with a third metal feature, wherein the third metal feature is wider than the second metal feature.

2. The method of claim 1, wherein replacing the second metal feature with the third metal feature comprises:
   removing the second metal feature by etching a first opening through the second dielectric layer, wherein the first opening exposes and is wider than the first metal feature; and
   filling the first opening with a metallic material to form the third metal feature.

3. The method of claim 1 further comprising:
   patterning a second opening extending through the second dielectric layer and exposing the gate electrode; and
   filling the second opening with a metallic material to form a fourth metal feature electrically connected to the gate electrode.

4. The method of claim 3, wherein the second opening is at least as wide as the third metal feature.

5. The method of claim 1, wherein forming the first metal feature comprises:
   patterning a third opening through the first dielectric layer, wherein the third opening exposes a doped region of the semiconductor substrate; and
   filling the third opening with a metallic material to form the first metal feature.

6. The method of claim 5, wherein the doped region of the semiconductor substrate is an anode of a diode, a cathode of a diode, or a guard ring encircling a device region comprising a plurality of devices.

7. The method of claim 1 further comprising forming a fourth metal feature in the second dielectric layer, wherein the fourth metal feature remains in the second dielectric layer after replacing the second metal feature with the third metal feature.

8. A method comprising
   depositing a first dielectric layer over a first source/drain region at a surface of a semiconductor substrate, wherein the first dielectric layer extends along sidewalls of a gate electrode adjacent the first source/drain region;
   forming a first source/drain contact extending through the first dielectric layer and electrically connected to the first source/drain region;
   depositing a second dielectric layer over the first dielectric layer;
   patterning a first opening through the second dielectric layer and exposing the first source/drain contact;
   filling the first opening with a conductive material to form a first conductive via in the second dielectric layer;
   after forming the first conductive via, patterning a second opening through the second dielectric layer and exposing the gate electrode, wherein the second opening is wider than the first opening; and
   filling the second opening with a conductive material to form a gate contact in the second dielectric layer.

9. The method of claim 8 further comprising:
   forming a second conductive via in the second dielectric layer; and
   replacing the second conductive via with a third conductive via, wherein the third conductive via is wider than the second conductive via.

10. The method of claim 9, wherein the third conductive via is formed prior to patterning the second opening through the second dielectric layer.

11. The method of claim 9, wherein the second conductive via has substantially a same width as the first conductive via.

12. The method of claim 9, wherein the second conductive via is disposed directly over a diode or a guard ring.

13. The method of claim 8 further comprising:
   forming a second source/drain contact extending through the first dielectric layer and electrically connected to a second source/drain region, wherein the second source/drain region is disposed adjacent to and on an opposing side of the gate electrode as the first source/drain region;
   patterning a second opening through the second dielectric layer and exposing the second source/drain contact; and
   filling the second opening with a conductive material to form a fourth conductive via in the second dielectric layer, wherein the gate contact is formed after forming the fourth conductive via.

14. A method comprising:
   depositing a dielectric layer over a gate electrode, the gate electrode being disposed on a top surface of a semiconductor substrate;
   forming a first conductive feature in the dielectric layer, the first conductive feature being electrically connected to a doped region at the top surface of the semiconductor substrate;
   etching the dielectric layer and the first conductive feature to remove the first conductive feature and define a first opening extending through the dielectric layer, the first opening being wider than the first conductive feature;
   etching a second opening extending through the dielectric layer and exposing the gate electrode; and
   filling the first opening and the second opening with a conductive material to define a second conductive feature and a third conductive feature extending through the dielectric layer, the second conductive feature being electrically connected to the doped region, and the third conductive feature being electrically connected to the gate electrode.

15. The method of claim 14, wherein the doped region is an anode of a diode, a cathode of a diode, or a guard ring encircling a device region comprising a plurality of devices.

16. The method of claim 14, wherein the second opening is wider than the first conductive feature.

17. The method of claim 14, wherein etching the second opening is performed after etching the first opening.

18. The method of claim 17, wherein etching the second opening comprises using a patterned mask as an etching mask, and wherein a portion of the patterned mask is disposed in the first opening while etching the second opening.

19. The method of claim 14 further comprising forming a fourth conductive feature electrically connected to the doped region, the first opening exposing the fourth conductive feature, and the second conductive feature is wider than the fourth conductive feature.

20. The method of claim 14 further comprising forming a fifth conductive feature in the dielectric layer while forming the first conductive feature, and the fifth conductive feature remaining after filling the first opening and the second opening with the conductive material.

\* \* \* \* \*